United States Patent [19]
Miyamoto et al.

[11] Patent Number: 5,759,006
[45] Date of Patent: Jun. 2, 1998

[54] SEMICONDUCTOR WAFER LOADING AND UNLOADING APPARATUS, AND SEMICONDUCTOR WAFER TRANSPORT CONTAINERS FOR USE THEREWITH

[75] Inventors: Saburo Miyamoto; Minoru Ametani, both of Takatsuki, Japan

[73] Assignee: Nitto Denko Corporation, Osaka, Japan

[21] Appl. No.: 658,071

[22] Filed: Jun. 4, 1996

[30] Foreign Application Priority Data

Jul. 27, 1995 [JP] Japan ................. 7-212639

[51] Int. Cl.$^6$ ........................ H01L 21/68
[52] U.S. Cl. .............. 414/416; 414/217; 414/222; 414/789.5; 414/936; 414/937; 414/757; 53/244
[58] Field of Search .................. 414/744.2, 403, 414/416, 757, 754, 217, 222, 331, 789.5, 935, 936, 937, 939, 940, 941, 793; 118/719, 500; 53/244; 364/478.02

[56] References Cited

U.S. PATENT DOCUMENTS

| | | |
|---|---|---|
| 3,693,321 | 9/1972 | Nilsson ............... 414/789.5 X |
| 4,806,059 | 2/1989 | Gössl et al. ........... 414/789.5 X |
| 4,842,136 | 6/1989 | Nakazato et al. . |
| 5,061,144 | 10/1991 | Akimoto et al. . |

FOREIGN PATENT DOCUMENTS

| | | | |
|---|---|---|---|
| 0582018 | 2/1994 | European Pat. Off. ........ 414/937 |
| 198948 | 8/1990 | Japan ..................... 414/789.5 |
| 157756 | 5/1992 | Japan ..................... 414/936 |
| 95/17004 | 6/1995 | WIPO . |

*Primary Examiner*—Frank E. Werner
*Attorney, Agent, or Firm*—Nikaido, Marmelstein, Murray & Oram LLP

[57] ABSTRACT

A transport container for transporting a plurality of semiconductor wafers as stacked therein. The container includes a box-shaped container body having four peripheral walls, and an upper lid for closing and opening an upper opening of the container body. The front wall of the container body is pivotable between an open position and a closed position. The upper lid and front wall are opened when the semiconductor wafers are loaded into or unloaded from the transport container. An apparatus is provided for loading and unloading the semiconductor wafers into/from the transport container. The apparatus includes a cassette table for supporting a cassette for storing the semiconductor wafers in multiple stages at predetermined intervals, a container table for supporting the transport container openable and closable for storing the semiconductor wafers stacked alternately with protective sheets of guard paper, and a robot arm substantially opposed to each of the cassette table and the container table for transporting the semiconductor wafers between the cassette and the transport container.

4 Claims, 11 Drawing Sheets

SEMICONDUCTOR WAFER LOADING AND UNLOADING APPARATUS, AND SEMICONDUCTOR WAFER TRANSPORT CONTAINERS FOR USE THEREWITH

BACKGROUND OF THE INVENTION (1) Field of the Invention

This invention relates to apparatus for loading and unloading semiconductor wafers (hereinafter referred to simply as wafers also) and to wafer transport containers for use therewith. More particularly, such apparatus are used to unload wafers from cassettes and load the wafers in a stacked state in the transport containers, or to unload wafers from the transport containers and load the wafers in the cassettes, when transporting the wafers in packages from a wafer manufacturing plant to a separate, semiconductor device assembly plant.

(2) Description of the Related Art

The above containers are used in transporting the wafers in packages from a wafer manufacturing plant to a separate, semiconductor device assembly plant. The apparatus noted above are operable to unload wafers from cassettes in which the wafers are arranged in multiple stages at predetermined intervals, and load the wafers in a stacked state in the transport containers, or to unload wafers from the transport containers and load the wafers in the cassettes.

Conventionally, one apparatus is used exclusively to unload the wafers from the cassettes in which the wafers are arranged in multiple stages at predetermined intervals, and load the wafers in a stacked state in the transport containers, and another apparatus is used exclusively to unload wafers from the transport containers and load the wafers in the cassettes. The entire apparatus therefore tends to be large and costly.

Each transport container used for the above purpose may be the type having a container body for storing a plurality of semiconductor wafers arranged in vertical posture at predetermined intervals, and an upper lid placed on the container body. Another type of transport container includes a cylindrical or box-shaped container body for storing a plurality of semiconductor wafers in a stacked state, and an upper lid placed on an upper end of the container body.

The former type of container for storing semiconductor wafers arranged in vertical posture has the advantage of allowing the wafers to be loaded and unloaded relatively easily. However, since this container supports the wafers in positions adjacent edges thereof, the wafers to be stored therein are limited to those strong wafers having a thickness in the order of 350 to 800 μm before back grinding, for example. When this container is used in transporting wafers having a thickness in the order of 150 to 300 μm after back grinding, the wafers could easily be cracked by vibrations or the like occurring during transport.

The latter transport container for storing semiconductor wafers in a stacked state supports the wafers at surfaces thereof. Thus, this type of container can transport even thin wafers without damage done thereto. However, when the wafers are loaded into or unloaded from the container body by using a suction arm or the like, the wafers must be moved in horizontal posture only through the upper opening of the container body. When the wafers are moved vertically for storage in the container body or for withdrawal therefrom, edges of the wafers could easily knock against inner walls or opening of the container body. Thin wafers in horizontal posture will easily be broken or chipped though a contact made in a vertical direction. Thus, a troublesome operation is required, such as moving wafers into and out of the container body at ultraslow speed or operating the suction arm or the like with high precision. In particular, the deeper the container is, the greater vertical amount the wafers must be moved, entailing a correspondingly greater possibility of contact, thereby to encounter the above inconvenience.

Further, the conventional transport containers have no function to release static electricity from wafers or to preclude static electricity from being generated during transport. Such static electricity may ruin semiconductor elements in the wafers.

SUMMARY OF THE INVENTION

This invention has been made having regard to the state of the art noted above, and its object is to provide an apparatus for loading and unloading semiconductor wafers, which apparatus has a small overall construction and is low cost, with functional components arranged in a rational manner and for combined use.

Another object of this invention is to provide a transport container for storing numerous semiconductor wafers in a stacked state, and yet allowing the wafers to be loaded and unloaded easily and free of damage.

A further object of this invention is to provide a transport container having an antistatic function.

The first-mentioned object is fulfilled, according to this invention, by an apparatus for loading and unloading a plurality of semiconductor wafers into/from a transport container for transporting the semiconductor wafers as stacked therein, the apparatus comprising:

a cassette table for supporting a cassette for storing the semiconductor wafers in multiple stages at predetermined intervals;

a container table for supporting the transport container openable and closable for storing the semiconductor wafers stacked alternately with protective sheets of guard paper; and a handling robot substantially opposed to each of the cassette table and the container table and including a robot arm for transporting the semiconductor wafers between the cassette and the transport container.

When the apparatus according to this invention is used for packing and transporting semiconductor wafers, the handling robot is operated to hold and unload the wafers, one at a time, from the cassette placed on the cassette table, and to move the wafers into the transport container in an open state and stack the wafers therein. The operation of the handling robot to supply the semiconductor wafers into the transport container is carried out alternately with an operation of the same handling robot or a separately provided handling robot, or a manual operation, to supply guard paper. When a predetermined number of wafers have been loaded in the stacked state, the transport container is closed and transported out of the apparatus.

When this apparatus is used for unloading semiconductor wafers transported in the transport container, the transport container is opened on the container table, and the handling robot is operated to hold and unload the wafers, one at a time, from the container and load the wafers into the cassette. The operation of the handling robot to load the semiconductor wafers into the cassette is carried out alternately with an operation of the same handling robot or a separately provided handling robot, or a manual operation, to remove guard paper from the transport container.

As noted above, the apparatus according to this invention may be used both for transferring semiconductor wafers from the cassette to the transport container and for transferring wafers from the transport container to the cassette. This construction realizes a cost reduction, compared with a case of providing separate apparatus dedicated to the two transfer operations. Besides, the entire apparatus may be formed compact by arranging the respective functional components as substantially opposed to the handling robot.

Preferably, the semiconductor wafer loading and unloading apparatus according to this invention further comprises an aligner for positionally adjusting the semiconductor wafers delivered thereto, and/or a guard paper transport mechanism for transporting the guard paper into and out of the transport container, wherein the handling robot is substantially opposed to each of the cassette table, the container table and the aligner, the robot arm being swivelable, vertically movable, horizontally extendible and retractable, and rotatable to turn upside down, for transporting the semiconductor wafers among the cassette, the aligner and the transport container.

When the apparatus having the above construction is used for packing and transporting semiconductor wafers, the handling robot is operated to unload the wafers by supporting the wafers at reverse surfaces thereof, one at a time, from the cassette placed on the cassette table. The handling robot first supplies each wafer to the aligner for adjusting the wafer to a predetermined position and posture. Thereafter, the handling robot picks up the wafer again. The handling robot is swiveled to a position opposed to the container table, and the robot arm is rotated to turn the wafer upside down. In this way, the handling robot successively moves the wafers into the transport container in an open state and stacks the wafers therein. The operation of the handling robot to supply the semiconductor wafers into the transport container is carried out alternately with an operation of the guard paper transport mechanism to supply guard paper. When a predetermined number of wafers have been loaded in the stacked state, the transport container is closed and transported out of the apparatus.

When this apparatus is used for unloading semiconductor wafers transported in the transport container, the transport container is opened on the container table, and the handling robot is operated to unload the wafers by supporting the wafers at reverse surfaces thereof, one at a time, from the container. Subsequently, the guard paper transport mechanism is operated to remove guard paper from the transport container. These operations are repeated alternately. The wafers unloaded are turned over so that obverse surfaces thereof face upward, and are successively supplied to the aligner. After the wafers are adjusted to a predetermined position and posture, the handling robot picks up the wafers again, and load them into the cassette.

The use of the aligner noted above allows the wafer transfer operations to be carried out reliably.

Preferably, the handling robot is operable for extending the robot arm into the cassette placed on the cassette table storing the semiconductor wafers at the predetermined intervals, with patterned surfaces facing up, to suck a reverse surface of each of the semiconductor wafers and remove each semiconductor wafer, and when loading the semiconductor wafers into the transport container, operable for rotating the robot arm suction-supporting the reverse surface of each semiconductor wafer to turn upside down each semiconductor wafer, and thereafter stacking each semiconductor wafer with the patterned surface facing down in the transport container, whereby the semiconductor wafers are stacked with the sheets of guard paper inserted in between.

Preferably, the semiconductor wafer loading and unloading apparatus according to this invention further comprises an identification data reader for picking up images of surfaces of the semiconductor wafers positionally adjusted by the aligner to read identification data from the surfaces of the semiconductor wafers. By reading the identification data along with the wafers per se, the wafers may be stored in different transport containers or different cassettes as classified according to type.

In another aspect of this invention, there is provided a transport container for transporting a plurality of semiconductor wafers as stacked therein, comprising:

a box-shaped container body having four peripheral walls; and an upper lid for closing and opening an upper opening of the container body;

the container body having a peripheral front wall pivotable between an open position and a closed position.

According to this invention, for loading wafers into the container, the upper lid and peripheral front wall are opened to expose upper and front regions of the container body extensively. In the upwardly and frontally wide opened state, a wafer suction-supported by a suction arm is inserted into the container body through the open front region and at a slightly higher level than a preceding wafer already deposited. The suction arm is lowered to stack the wafer on the preceding wafer. Subsequently, the above operation is repeated while gradually raising the inserting level. In this way, a plurality of wafers may be stacked efficiently. Despite progress of the stacking operation, the amount of descent for each wafer within the container may be a minimum amount necessary for stacking the wafer upon a preceding wafer, which remains the same for each wafer. This minimizes the possibility of the wafers contacting inner surfaces of the container during the descent. Even if the wafers contact an inner surface of the container during the horizontal movement through the front region into the container body, this contact occurs in a direction perpendicular to the direction of thickness of the wafers, which hardly results in damage or chipping. In an actual loading operation, protective guard paper is placed between adjacent wafers. When unloading wafers from the container, the upper lid and front wall are opened wide, and the suction arm is operated in a sequence reversed from the above. The wafers are removed forwardly of the container one after another, while minimizing vertical movement of the wafers inside the container.

The peripheral front wall may be connected integrally with a front edge of a bottom wall of the container body through a thin wall hinge. Similarly, the upper lid may be connected integrally with an upper edge of a peripheral rear wall through a thin wall hinge. With this construction, the container body including the peripheral front wall, or the container body and upper lid, may be formed through a single plastic molding operation.

Preferably, the upper lid includes an elastic element formed on a lower surface thereof for pressing the semiconductor wafers stacked in the container body. During transport, the elastic element on the lower surface of the upper lid presses the wafers stacked in the container body. This suppresses vertical play of the wafers in the container, to avoid cracking and chipping of the wafers.

Preferably, the peripheral front wall and a peripheral rear wall include a plurality of ribs formed on inner surfaces thereof, respectively, for contacting and positioning edges of the semiconductor wafers stacked in the container body. These ribs suppress horizontal play of the wafers during transport, and facilitate loading and unloading of the wafers into/from the transport container.

Further, the peripheral front wall may include side pieces extending inwardly from opposite lateral ends thereof to fit between inner surfaces of a pair of opposed peripheral side walls, each of the side pieces and each of the inner surfaces of the peripheral side walls having an engaging structure therebetween for retaining the peripheral front wall in an upright posture. Similarly, the upper lid may include a skirt wall for fitting on upper regions of the peripheral front wall and peripheral side walls of the container body, an engaging structure being provided between an inner surface of a front portion of the skirt wall and an outer surface of the peripheral front wall for retaining the upper lid in a closed position. This construction facilitates opening and closing of the peripheral front wall and upper lid.

In order to protect the wafers from damage done by static electricity during transport and in time of loading and unloading, the container body preferably has conductivity at least in a portion thereof for contacting the semiconductor wafers stacked therein. Specifically, the container body may be formed of a conductive resin. Alternatively, the peripheral front wall and a peripheral rear wall may include a plurality of conductive ribs formed on inner surfaces thereof, respectively, for contacting and positioning edges of the semiconductor wafers stacked in the container body. It is preferred that a conductive material is fitted in positions of a bottom wall of the container body for contacting the conductive ribs, the conductive material being exposed from inner and outer surface of the bottom wall. Then, static electricity in the container is advantageously released to the outside through the conductive material.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Preferred embodiments of this invention will be described in detail hereinafter with reference to the drawings.

<Apparatus for Loading and Unloading Semiconductor Wafers>

Figure 1:
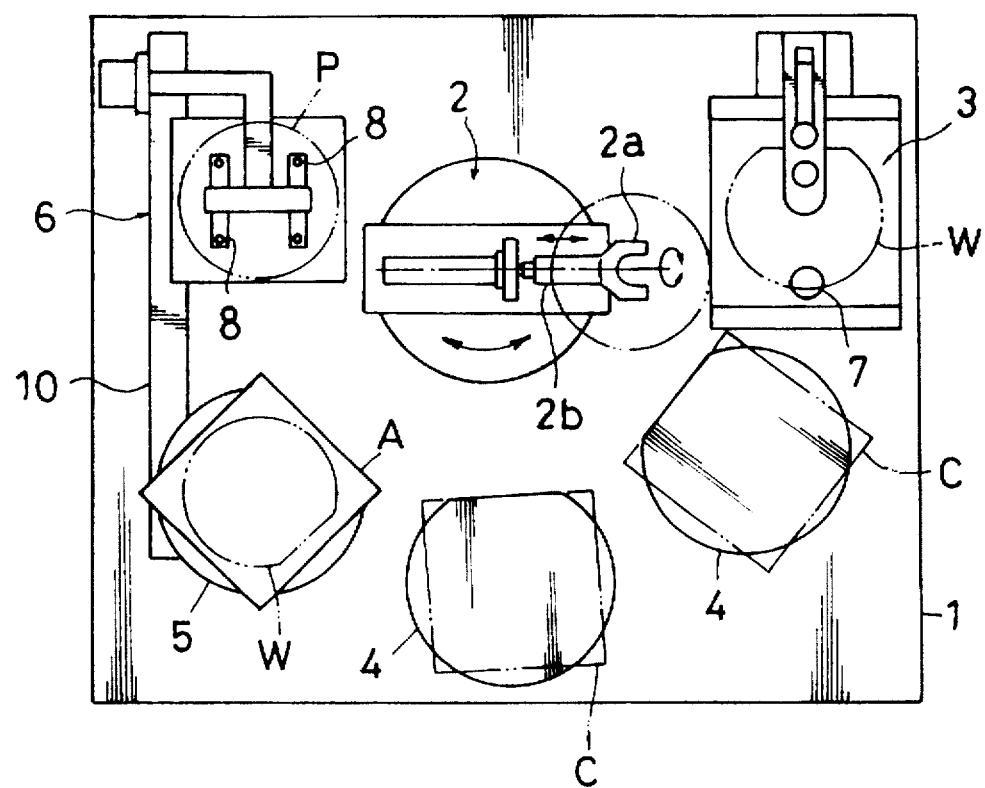
FIG. 1 is an overall plan view of an apparatus for loading and unloading semiconductor wafers according to this invention.
Figure 2:
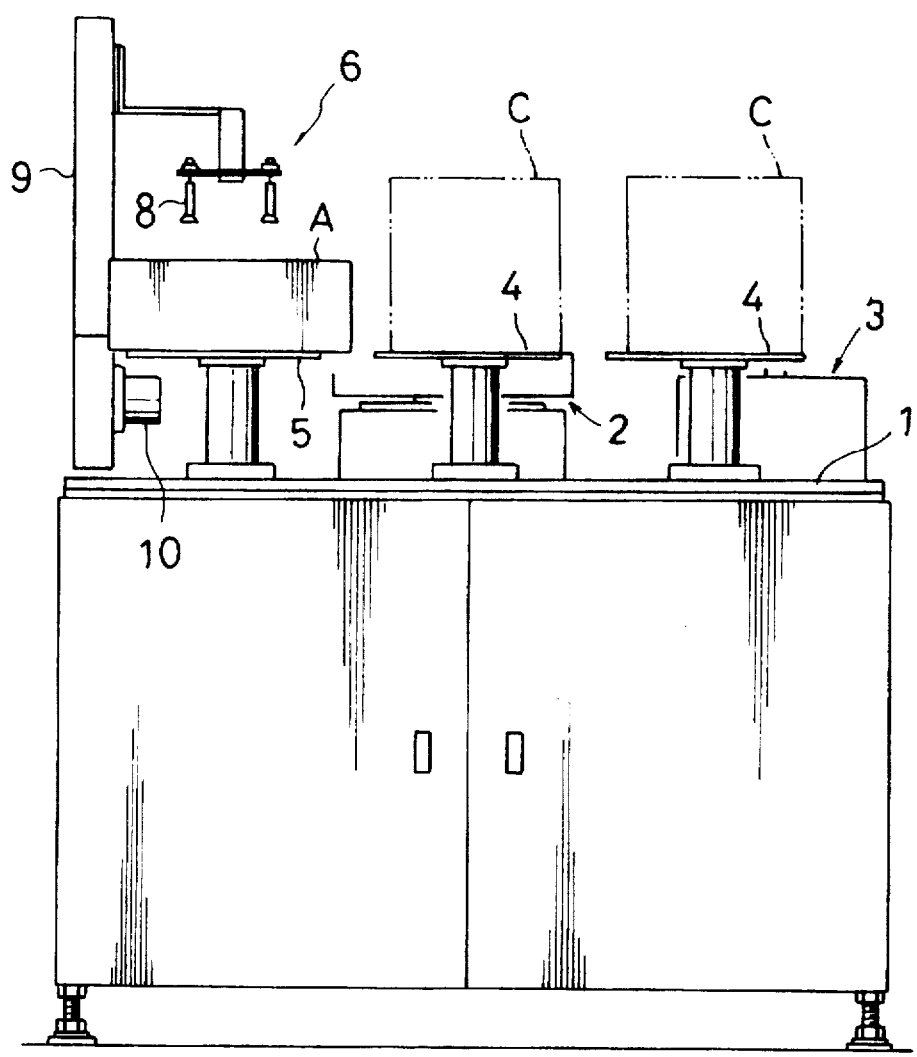
FIG. 2 is an overall front view of the apparatus according to this invention.
Figure 3:
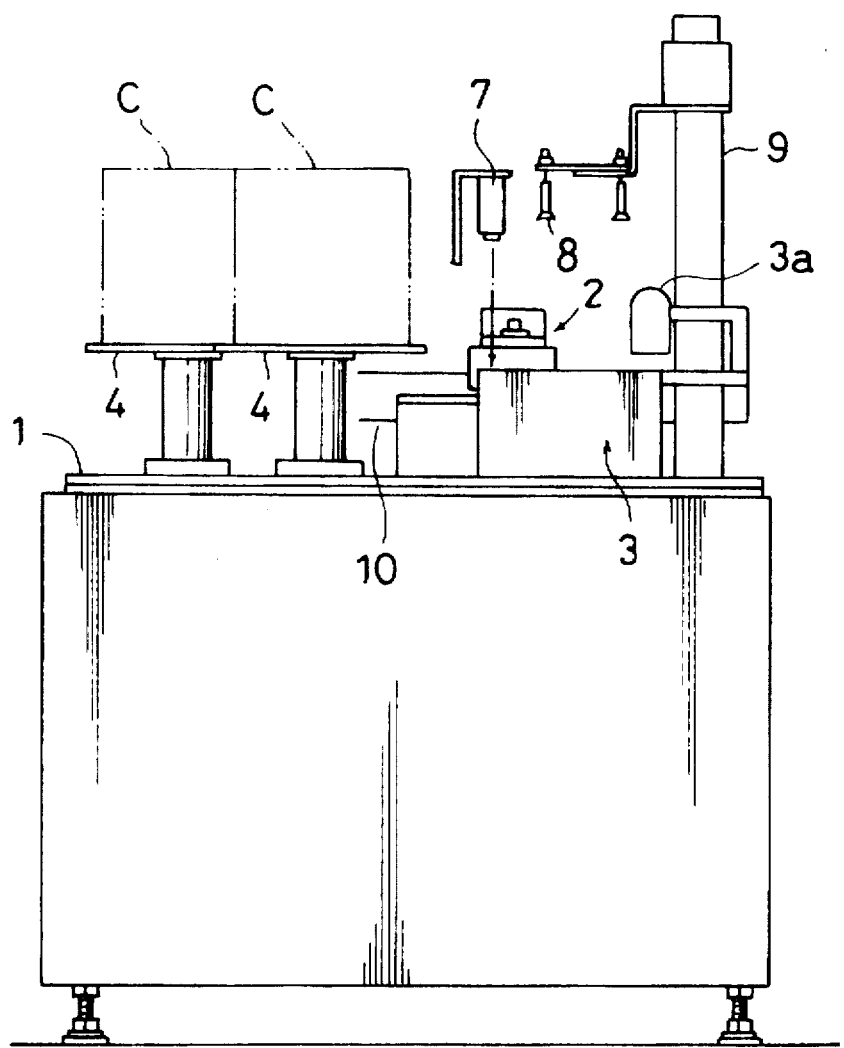
FIG. 3 is an overall side view of the apparatus according to this invention.

FIG. 1 is an overall plan view of an apparatus embodying this invention. FIG. 2 is an overall front view of the apparatus, and FIG. 3 is an overall side view thereof. The semiconductor wafer loading and unloading apparatus in this embodiment includes an apparatus base frame 1 having a handling robot 2 mounted in a substantially central position thereon. The robot 2 is surrounded by an aligner 3, two cassette tables 4, a transport container table 5 and a guard paper transport mechanism 6, all arranged on the base frame 1. The entire apparatus is built compact by arranging these mechanisms in an opposed relationship to the handling robot 2. The respective components will be described hereinafter.

The handling robot 2 includes a suction head 2a secured to a robot arm 2b which is swivelable, vertically movable, horizontally extendible and retractable, and rotatable to turn upside down. By swiveling movement the robot arm 2b may be directed to a selected one of the aligner 3, cassette tables 4 and container table 5. By vertical and horizontal movement, the robot arm 2b may be set to a desired height and extended to and retracted from the aligner 3, cassette table 4 or container table 5. By rotation of the robot arm 2b, the suction surface of suction head 2a may be turned upward or downward.

The aligner 3 includes a photoelectric sensor 3a or the like (FIG. 3) for picking up an image of an orientation flat of wafer W delivered thereto, thereby to detect a position and orientation of wafer W. The aligner 3 then adjusts the wafer W to a predetermined position and orientation as necessary. A CCD camera 7 is disposed above the aligner 3 for reading identification data affixed to the surface of wafer W by etching or other means.

Each cassette table 4 is constructed to support a cassette C for storing a plurality of wafers W arranged, with obverse surfaces turned upward, at fixed vertical intervals determined by grooves and notches. The cassette C is fixed to the cassette table 4 to have a wafer inlet/outlet opening directed toward a swivel axis of the handling robot 2.

The container table 5 supports a transport container A as shown in FIGS. 4 through 10. The transport container A includes a box-shaped container body 21 having four peripheral walls, and an upper lid 22 for closing an upper opening of the container body 21. The front wall 21b of the container body 21 is pivotable to open and close. The transport container A will be described in greater detail hereinafter.

The guard paper transport mechanism 6 includes a plurality of suction pads 8 supported to be vertically movable along an upstanding frame 9 which is in turn movable fore and aft along a fore-and-aft frame 10. This transport mechanism 6 transports guard paper P suction-supported by the suction pads 8 to supply guard paper P to the transport container A from above, or sucks to the suction pads 8 and collects sheets of guard paper P stacked alternately with wafers W in the cassette C.

The semiconductor wafer loading and unloading apparatus in this embodiment has the above construction, and is used in transferring wafers W from cassette C to transport container A and from transport container A to cassette C.

[Wafer Transfer from Cassette C to Transport Container A]

(1) For this process, a cassette C or cassettes C storing wafers W arranged in multiple stages with patterned surfaces turned upward is/are placed on one or both of the cassette tables 4. The cassette C or cassettes C is/are fixed to the facing direction described hereinbefore. The upper lid 22 and front wall 21b of the transport container A on the container table 5 are opened.

(2) First, the robot arm 2b is extended into the cassette C or one of the cassettes C. The robot arm 2b removes a wafer W with the reverse surface thereof suction-supported by the suction head 2a turned upward. Next, the robot arm 2b supplies the wafer W, with the obverse surface (patterned surface) facing up, onto a horizontally movable turntable of the aligner 3. While rotating the wafer W on the turntable, the photoelectric sensor 3a or the like is operated to pick up images of peripheral edges of the wafer W, thereby to detect a position and orientation of wafer W. The aligner 3 then corrects the position and orientation. After the positional adjustment of wafer W, the suction head 2a sucks the wafer W facing up. Then, the robot arm 2b is swiveled to a position opposed to the front of the transport container A. During the swiveling movement, the robot arm 2b is rotated to turn the wafer W upside down.

(3) Next, the robot arm 2b is advanced with the suction head 2a supporting the wafer W upside down. After inserting the wafer W through the open front of the transport container A to a predetermined position therein, the robot arm 2b lowers and releases the wafer W in the container A.

(4) After loading the wafer W into the transport container A, the robot arm 2b is retracted to fetch a next wafer. Meanwhile, the guard paper transport mechanism 6 is operated to place a sheet of guard paper P on the wafer W deposited face down in the container A.

(5) The above operation is repeated to stack wafers W and sheets of guard paper P alternately. When a predetermined number of wafers W have been deposited in the stacked state, the front wall 21a and upper lid 22b of the transport container A are closed. The transport container A is removed from the container table 5, and a new transport container A is set to the table 5.

[Wafer Transfer from Transport Container A to Cassette C]

(1) For this process, empty cassettes C are fixed to both cassette tables 4, and a transport container A storing wafers W is placed on the container table 5. The upper lid 22 and front wall 21b of the transport container A are opened.

(2) First, the robot arm 2b is extended into the transport container A and withdraws therefrom an uppermost wafer W with the reverse surface (facing up) thereof sucked to the suction head 2a turned downward. Then, the suction head 2a is turned over to supply the wafer, with the obverse surface facing up, onto the turntable of the aligner 3.

(3) The CCD camera 7 is operated to pick up an image of wafer W positionally adjusted by the aligner 3, thereby to read identification data affixed to the wafer surface.

(4) Next, the robot arm 2b sucks the reverse surface of the wafer W having the patterned surface facing up. Based on the identification data read, the robot arm 2b is directed to a predetermined one of the cassettes C. Then, the robot arm 2b is extended to deposit the wafer W at an address designated in advance or at an upper or lower end position in that cassette C. The robot arm 2b is thereafter retracted to fetch a next wafer.

(5) Meanwhile, the guard paper transport mechanism 6 is operated to pick up and collect an uppermost sheet of guard paper P from the transport container A.

(6) The above operation is repeated to take wafers W and sheets of guard paper P alternately out of the transport container A. The wafers W taken out are stored in cassettes C as classified according to type.

The above embodiment may be modified as follows:

(1) The above apparatus includes two cassette tables 4 and one container table 5. However, the numbers of cassette tables and container tables may be varied as desired.

(2) Where there is no need to align orientation flats of wafers, the aligner 3 may be replaced by what is known as a centering mechanism only for centering the wafers.

(3) The aligner 3 or centering mechanism is dispensable where a displacement of wafers is immaterial in transferring the wafers between transport container and cassette.

(4) The guard paper transport mechanism 6 need not be provided where the wafer transport robot arm 2 is used also for transporting guard paper or where guard paper is transported manually.

(5) Bar codes may be employed as the identification data affixed to wafer surfaces. In this case, the CCD camera 7 is replaced by a bar code reader.

<Transport Container in First Embodiment>

Figure 4:
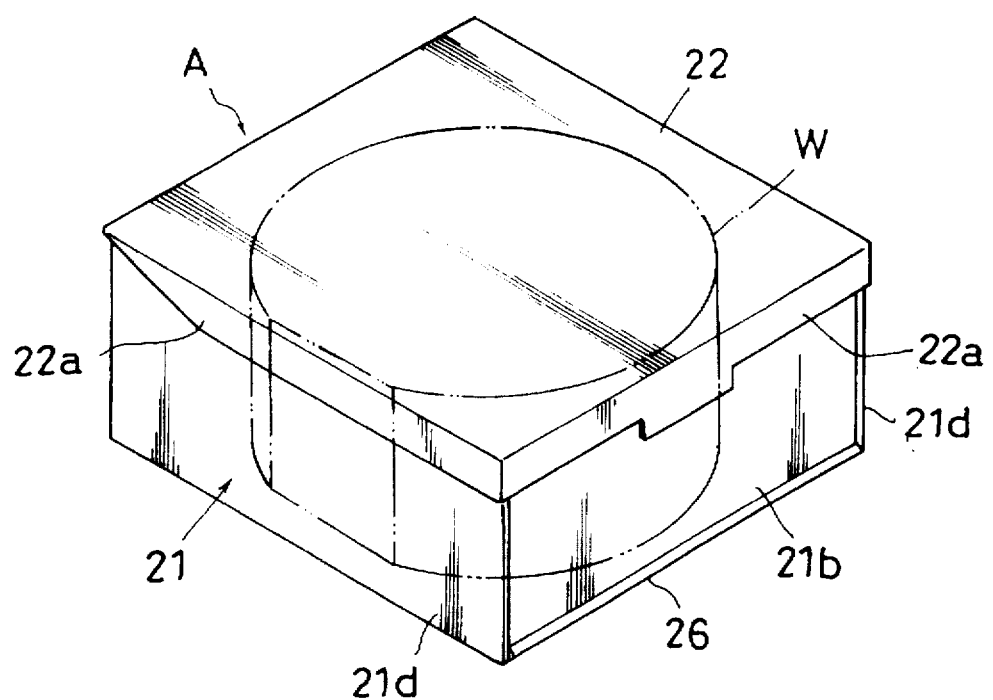
FIG. 4 is a perspective view showing an outward appearance of a transport container in a first embodiment of this invention.
Figure 5:
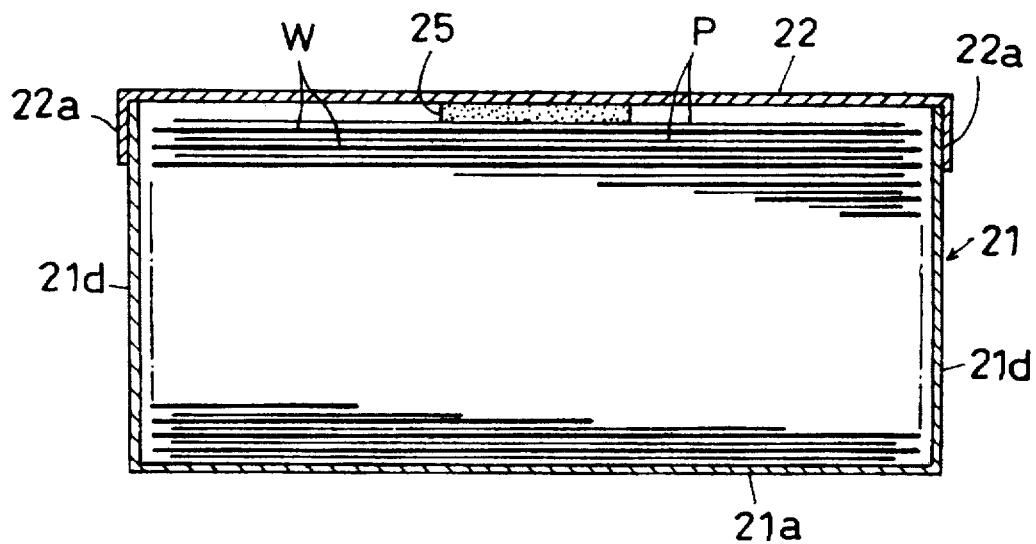
FIG. 5 is a front view in vertical section of the transport container storing wafers.
Figure 6:
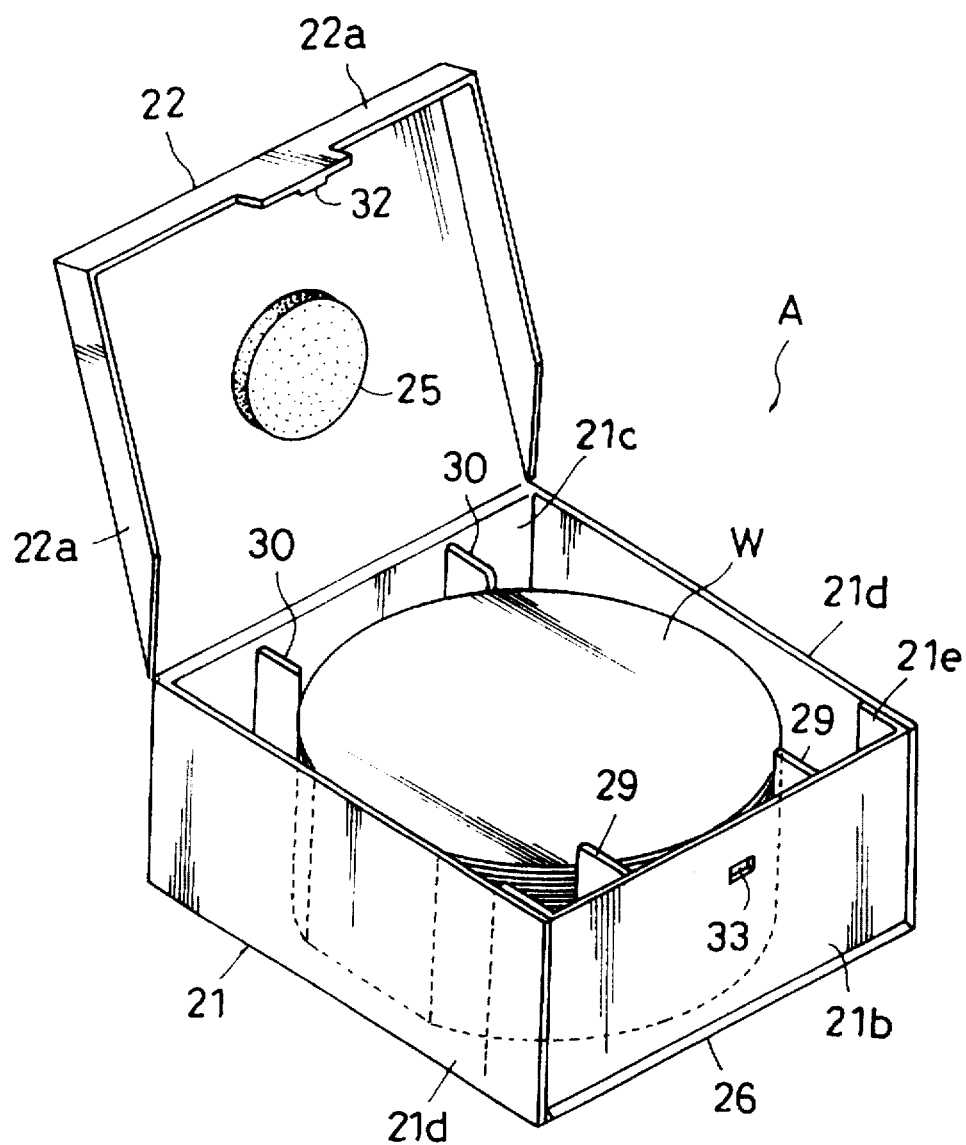
FIG. 6 is a perspective view of the transport container with an upper lid opened.
Figure 7:
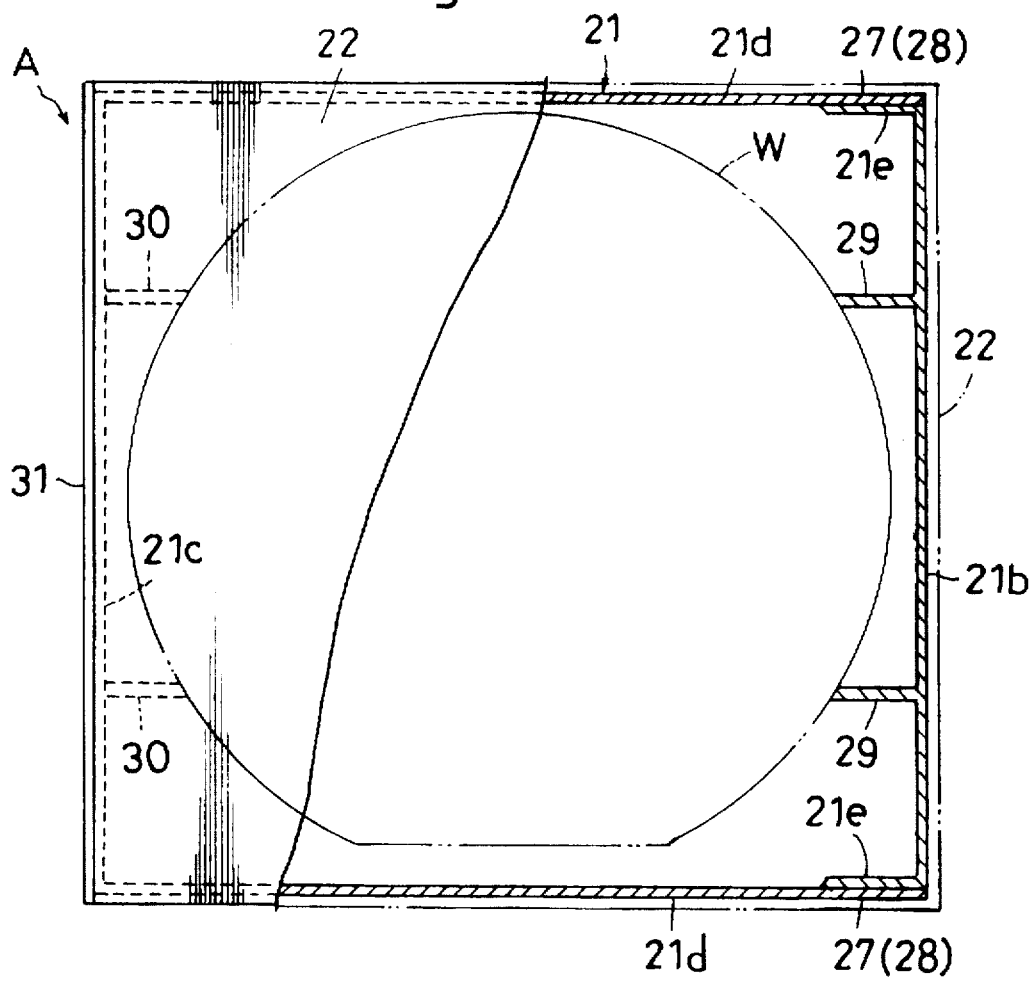
FIG. 7 is a plan view, partly in section, of the transport container.
Figure 8:
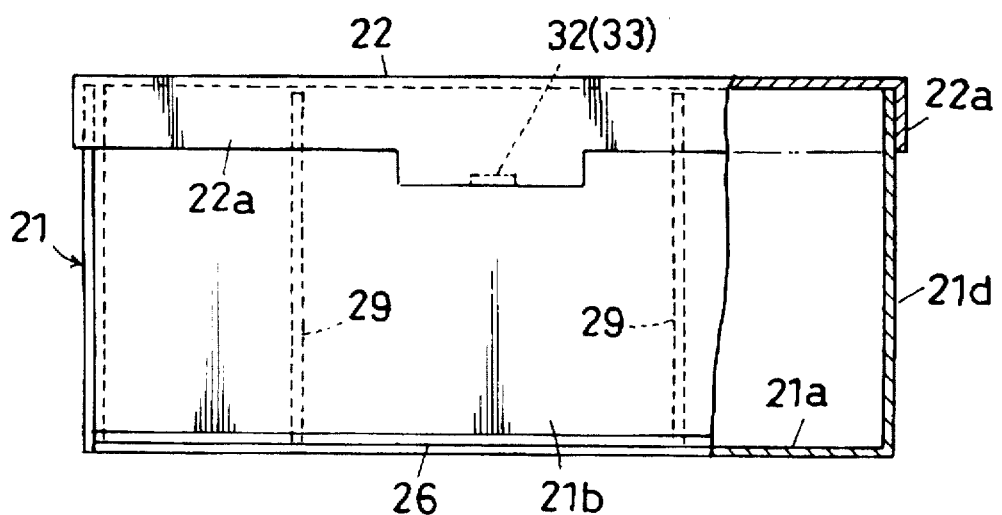
FIG. 8 is a front view, partly in section, of the transport container.
Figure 9:
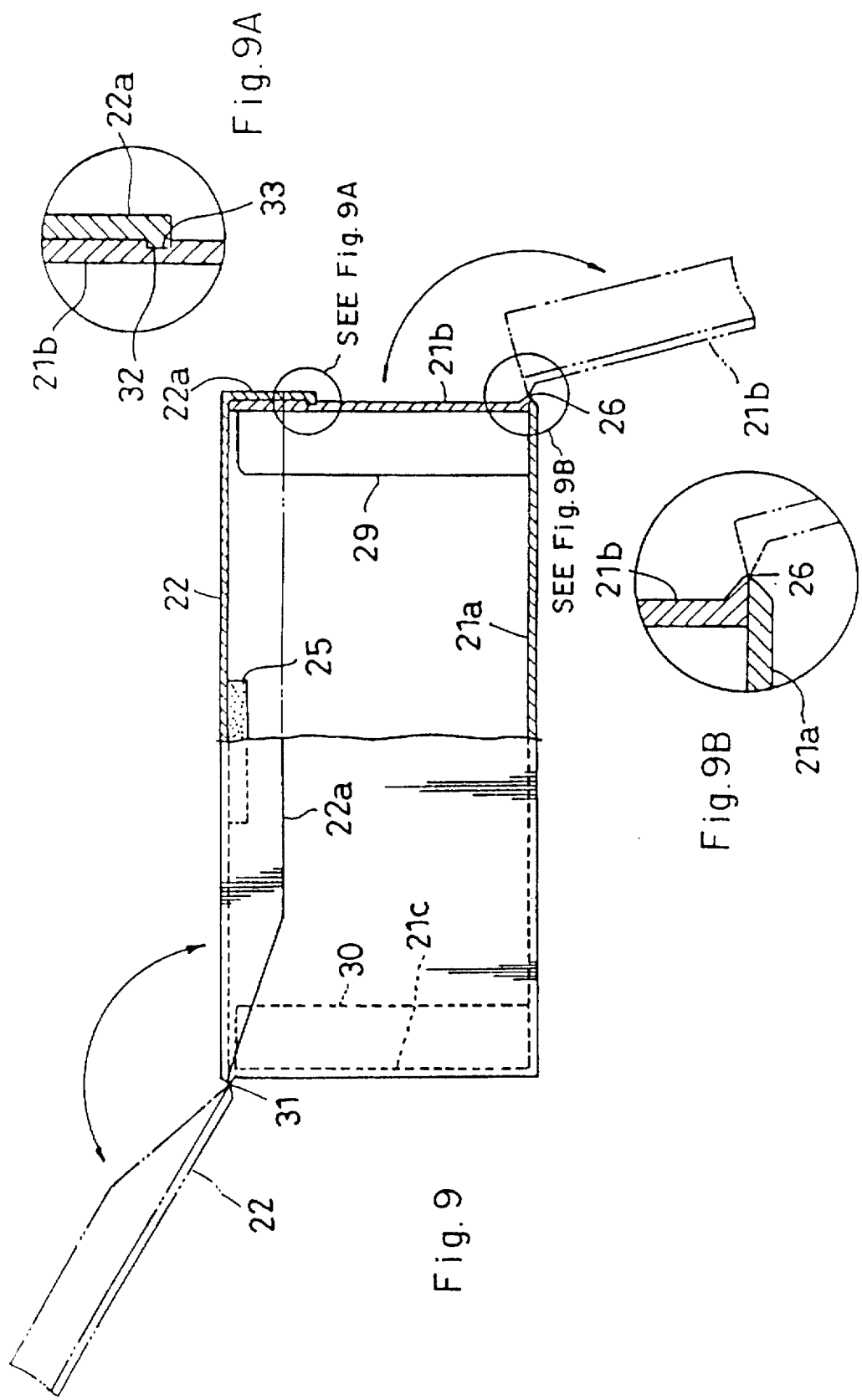
FIG. 9 is a side view, partly in section, of the transport container, with portions thereof shown in enlarged section.
Figure 10:
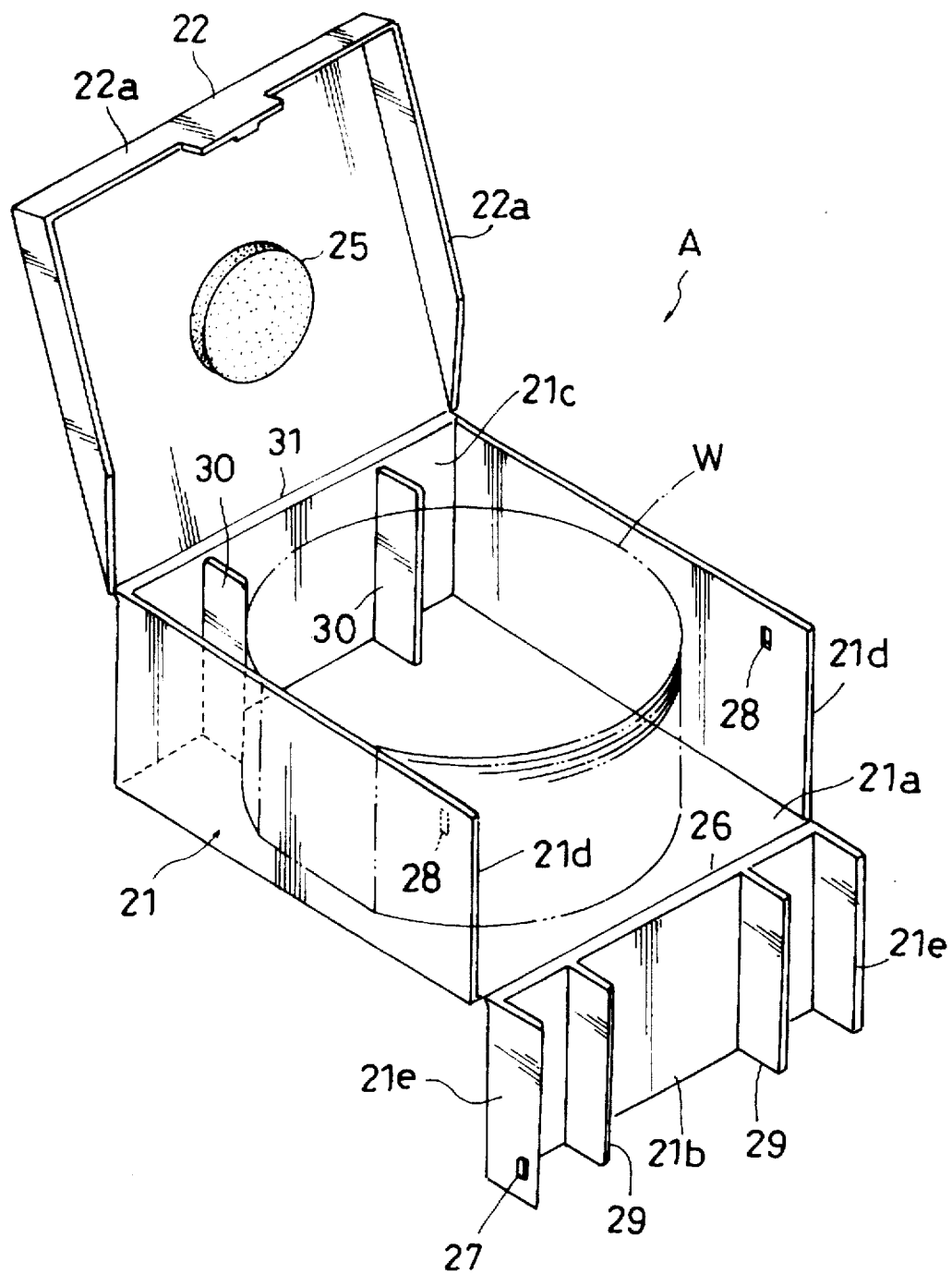
FIG. 10 is a perspective view of the transport container in an opened state.
Figure 11:
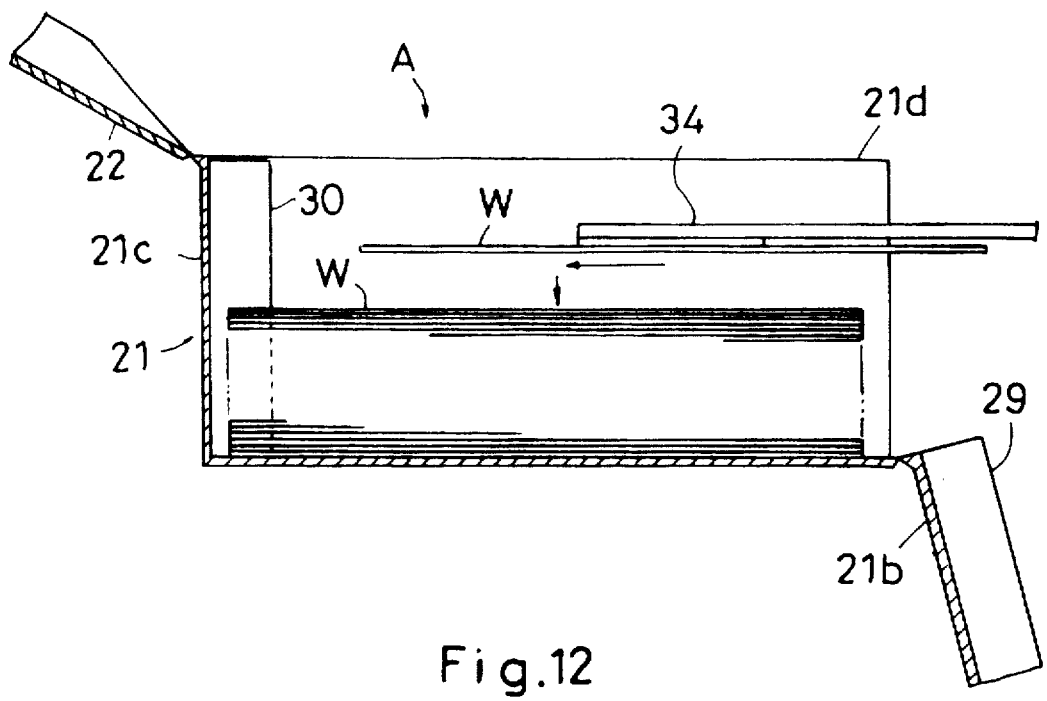
FIG. 11 is a schematic side view showing a loading or unloading operation.

FIG. 4 is a perspective view showing an outward appearance of a transport container in the first embodiment of this invention. FIG. 5 is a front view in vertical section of the transport container storing semiconductor wafers. FIG. 6 is a perspective view of the transport container with the upper lid opened. FIG. 7 is a plan view, partly in section, of the transport container. FIG. 8 is a front view, partly in section, of the transport container. FIG. 9 is a side view, partly in section, of the transport container, with portions thereof shown in enlarged section. FIG. 10 is a perspective view of the transport container in an opened state. FIG. 11 is a schematic side view showing a loading or unloading operation.

As shown in FIGS. 4 through 6, the semiconductor wafer transport container A includes a container body 21 in the form of a square box, and an upper lid 22 mounted on an upper end thereof. The transport container A stores semiconductor wafers W and sheets of protective guard paper P stacked alternately. The upper lid 22 has a cushion pad 25 formed of an elastic material such as sponge and pasted to an inner surface thereof. The cushion pad 25 is used to press the wafers W stacked, thereby to eliminate vertical play in the container A.

The container body 21 is formed of plastic and has a bottom wall 21a, front wall 21b, rear wall 21c and right and left side walls 21d integrated with one another. The front wall 21b is pivotably connected to a front edge of the bottom wall 21a through a thin wall hinge 26. Thus, the front wall 21b is switchable between an upright position to close the front plane of the container (FIG. 6) and a prostrate position to open the front plane to a large extent (FIG. 10). As shown in FIGS. 6 and 7, the front wall 21b has side pieces 21e extending inwardly from opposite lateral edges thereof to overlap parts of inner surfaces of the side walls 21d when the front wall 21b is in the upright position. A projection 27 is formed on an outer surface of each side piece 21e for engaging a recess 28 formed in the inner surface of the opposed side wall 21d, to retain the front wall 21b in the upright position closing the front plane of the container A.

The front wall 21b and rear wall 21c have right and left positioning ribs 29 and 30 formed on inner surfaces thereof, respectively. The wafers W are stacked with outer peripheries thereof positioned by a four-point support provided by free ends of the ribs 29 and 30. These ribs 29 and 30 act also as buffers for lessening shocks applied to the semiconductor wafers W during transport.

As shown in FIGS. 9 and 10, the upper lid 22 is pivotably connected to an upper edge of the rear wall 21c of the container body 21 through a thin wall hinge 31. The upper lid 22 includes a skirt wall 22a for fitting on upper regions of the front wall 21b and side walls 21d of the container body 21. The skirt wall 22a has a projection 32 formed on an inner surface of a front portion thereof for engaging a recess 33 formed in an outer surface of the front wall 21b, to retain the upper lid 22 in the closed position.

The above is the construction of the transport container in this embodiment. For loading wafers into the container, as shown in FIG. 11, the upper lid 22 and front wall 21b are opened to expose upper and front regions of the container body 21 extensively. In the upwardly and frontally wide opened state, a wafer W suction-supported by a suction arm 34 is inserted into the container body 21 through the open front region and at a slightly higher level than a preceding wafer W already deposited. The suction arm 34 is lowered to stack the wafer W on a sheet of guard paper P present on the preceding wafer. Subsequently, the above operation is repeated alternately with supply of guard paper P, while gradually raising the inserting level.

When a predetermined number of wafers have been deposited in the stacked state, the front wall 21b and upper lid 22 are closed, and the transport container A may be bound with a band or the like to fix the upper lid 22 in place.

For unloading wafers from the container, the upper lid 22 and front wall 21b are opened wide, and the suction arm is operated in a sequence reversed from the above. The wafers are removed forwardly of the container one after another, while minimizing vertical movement of the wafers inside the container.

This embodiment may be modified as follows:

(1) The front wall 21b and upper lid 22 may be provided as separate components, and connected to the bottom wall 21a and rear wall 21c through hinges, respectively.

(2) The front wall 21b may be connected to a front edge of one of the side walls 21d through a thin wall hinge or a separate hinge or hinges to be openable sideways.

(3) The rear wall 21c may be connected, integrally or otherwise, to one of the side walls 21d to be pivotable to an open position.

Figure 12:
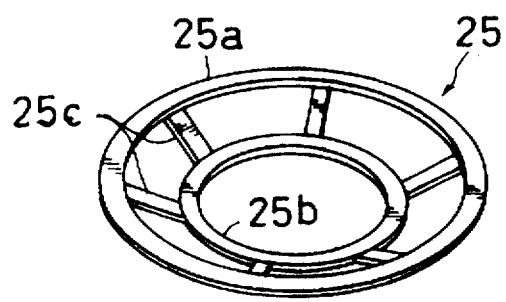
FIG. 12 is a perspective view of a modified cushion pad.
Figure 13:
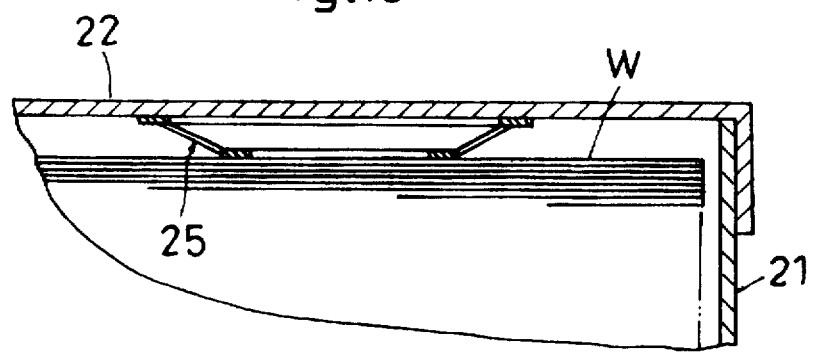
FIG. 13 is a fragmentary sectional view of the transport container employing the modified cushion pad.

(4) As shown in FIGS. 12 and 13, the cushion pad 25 attached to the inner surface of the upper lid 22 may be formed of plastic to have a large ring 25a and a small ring 25b interconnected through a plurality of elastically deformable arms 25c.

(5) The upper lid 22 may be in the form of a cap separable from the container body 21.

(6) The container may have a sealed construction with a foam material or the like having a sealing property applied to the skirt wall 22a of the upper lid 22 and the side pieces 21e of the front wall 21b.

(7) A handle or clasping element may be attached to the container.

<Transport Container in Second Embodiment>

Figure 14:
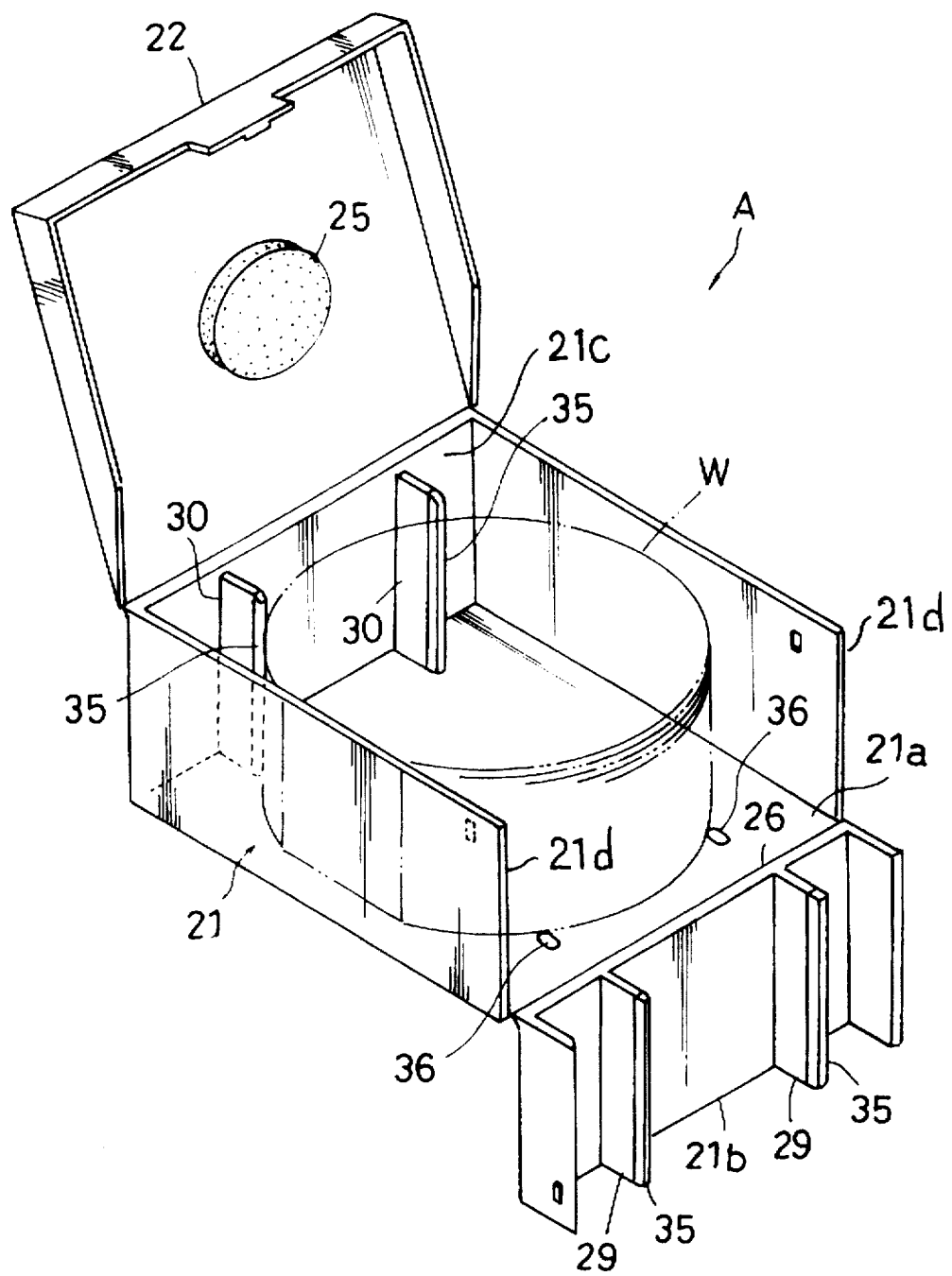
FIG. 14 is a perspective view of an opened transport container in a second embodiment of this invention.
Figure 15:
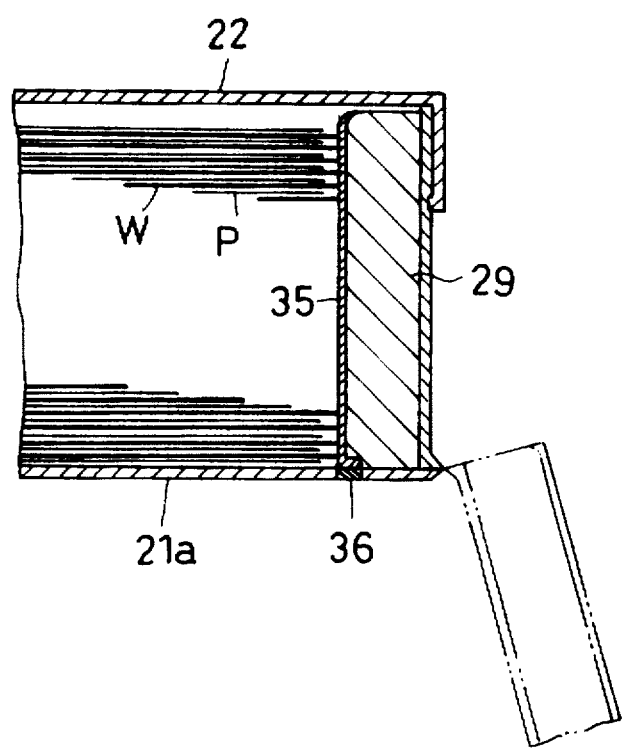
FIG. 15 is a fragmentary sectional view of the transport container in the second embodiment storing semiconductor wafers.

FIG. 14 is a perspective view of an opened transport container in a second embodiment of this invention. FIG. 15 is a fragmentary sectional view of the transport container storing semiconductor wafers. In these figures, like reference numerals are used to identify like parts in the first embodiment and will not be described again.

As shown in FIGS. 14 and 15, the right and left positioning ribs 29 and 30 formed on the inner surfaces of the front wall 21b and rear wall 21c have the free ends thereof coated with conductive films 35 such as of ITO (indium and tin oxide). The bottom wall 21a has bores formed in positions thereof directly under the conductive films 35 on the free ends of the ribs 29 and 30 in the upstanding posture when the front plane of the container body 21 is closed. A conductive material 36 such as copper or aluminum is fitted in these bores and exposed from inner and outer surfaces of the bottom wall 21a.

With the above construction, the wafers W stacked in the container are in four-point contact with the conductive films coated on the free ends of the ribs 29 and 30. Static electricity of the wafers W is passed to the conductive films 35, and is released through the conductive material 36 continuous from lower ends of the films 35a, to the table supporting the container.

This embodiment may be modified as follows:

(1) The entire container body 21 may be formed of a conductive resin containing carbon or surface active agent.

(2) Portions (e.g. ribs 29 and 30) of the container body 21 for contacting wafers W may be formed of a conductive resin.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for loading and unloading a plurality of semiconductor wafers into/from a transport container for transporting the semiconductor wafers as stacked therein, wherein said transport container is openable and closable for storing said semiconductor wafers stacked alternately with protective sheets of guard paper, and said apparatus comprising:

a base frame;

at least one cassette table on said base frame for supporting at least one cassette for storing said semiconductor wafers in multiple stages at predetermined intervals;

a container table on said base frame for supporting said transport container;

an aligner on said base frame for positionally adjusting said semiconductor wafers delivered thereto; and a handling robot on said base frame substantially opposed to each of said at least one cassette table, said aligner, and said container table and including a robot arm for transporting said semiconductor wafers between said at least one cassette, said aligner, and said transport container.

2. An apparatus as defined in claim 1, further comprising a guard paper transport mechanism on said base frame for transporting said guard paper into and out of said transport container, wherein said robot arm is swivelable, vertically movable, horizontally extendible and retractable, and rotatable to turn upside down, for transporting said semiconductor wafers among said cassette, said aligner and said transport container.

3. An apparatus as defined in claim 2, further comprising means on said handling robot operable for extending said robot arm into said cassette placed on said at least one cassette table storing said semiconductor wafers at said predetermined intervals, with patterned surfaces facing up, to suck a reverse surface of each of said semiconductor wafers and remove each semiconductor wafer, and when loading said semiconductor wafers into said transport container, operable for rotating said robot arm suction-supporting said reverse surface of each semiconductor wafer to turn upside down each semiconductor wafer, and thereafter stacking each semiconductor wafer with said patterned surface facing down in said transport container, whereby said semiconductor wafers are stacked with said sheets of guard paper inserted in between.

4. An apparatus as defined in claim 2, further comprising identification data reading means for picking up images of surfaces of said semiconductor wafers positionally adjusted by said aligner to read identification data from said surfaces of said semiconductor wafers.

* * * * *